US012612481B2

(12) United States Patent
Chae et al.

(10) Patent No.: US 12,612,481 B2
(45) Date of Patent: Apr. 28, 2026

(54) THERMOSETTING RESIN COMPOSITION AND ENCAPSULATION FILM USING THE SAME

(71) Applicant: LG CHEM, LTD., Seoul (KR)

(72) Inventors: Song A Chae, Daejeon (KR); Kwang Su Seo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 628 days.

(21) Appl. No.: 18/021,330

(22) PCT Filed: Aug. 18, 2021

(86) PCT No.: PCT/KR2021/010949
§ 371 (c)(1),
(2) Date: Feb. 14, 2023

(87) PCT Pub. No.: WO2022/039492
PCT Pub. Date: Feb. 24, 2022

(65) Prior Publication Data
US 2023/0295363 A1 Sep. 21, 2023

(30) Foreign Application Priority Data
Aug. 19, 2020 (KR) ........................ 10-2020-0104009

(51) Int. Cl.
| | |
|---|---|
| *C08F 236/08* | (2006.01) |
| *C08J 5/18* | (2006.01) |
| *C08K 5/14* | (2006.01) |
| *H10K 50/84* | (2023.01) |
| *H10K 50/844* | (2023.01) |

(52) U.S. Cl.
CPC .............. *C08F 236/08* (2013.01); *C08J 5/18* (2013.01); *C08K 5/14* (2013.01); *H10K*

*50/844* (2023.02); *H10K 50/846* (2023.02); *C08J 2309/00* (2013.01)

(58) Field of Classification Search
CPC ............. C08F 236/08; C08J 5/18; C08K 5/14
USPC .......................................................... 524/77
See application file for complete search history.

(56) References Cited

U.S. PATENT DOCUMENTS

| | | | |
|---|---|---|---|
| 9,676,928 B2 | 6/2017 | Liu et al. | |
| 2016/0093830 A1 | 3/2016 | Yoo et al. | |
| 2021/0226157 A1 | 7/2021 | Mok et al. | |

FOREIGN PATENT DOCUMENTS

| | | | | |
|---|---|---|---|---|
| CN | 106463647 A | 2/2017 | | |
| CN | 109312080 A | 2/2019 | | |
| KR | 10-1624572 B1 | 5/2016 | | |
| KR | 10-2016-0086317 A | 7/2016 | | |
| KR | 10-2016-0096048 A | 8/2016 | | |
| KR | 20160096048 A | * 8/2016 | ............... | C09J 7/38 |
| KR | 10-2018-0095035 A | 8/2018 | | |
| KR | 1020200051271 A | 5/2020 | | |
| WO | 2017/100924 A1 | 6/2017 | | |

* cited by examiner

*Primary Examiner* — Deve V Hall

(74) *Attorney, Agent, or Firm* — Bryan Cave Leighton Paisner LLP

(57) ABSTRACT

The present disclosure relates to a thermosetting resin composition, an encapsulation film, and an organic electronic device comprising the same, which is capable of forming a structure that can block moisture or oxygen flowing into an organic electronic device from the outside, and is intended to implement heat resistance and durability of the organic electronic device under severe conditions such as high temperatures.

17 Claims, 2 Drawing Sheets

[Figure 1]
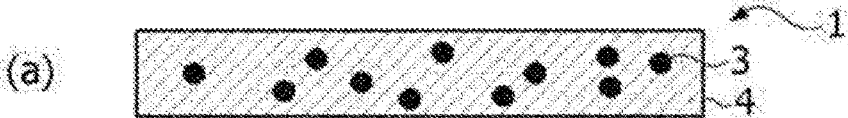
(a)
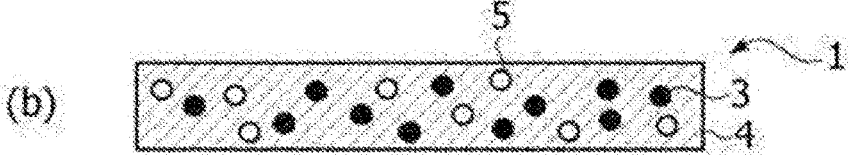
(b)
[Figure 2]
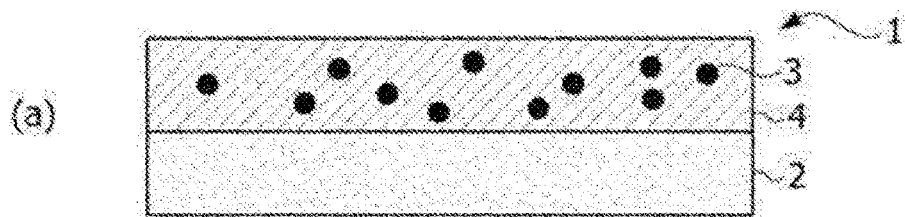
(a)
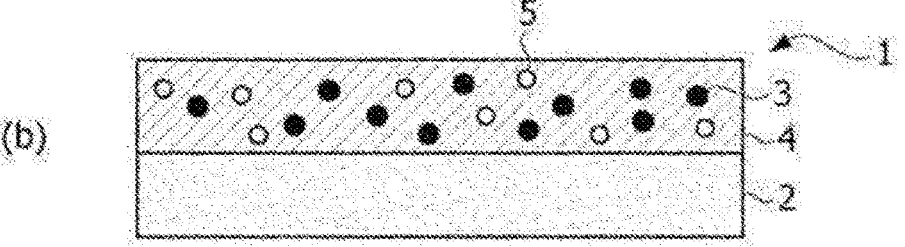
(b)

[Figure 3]
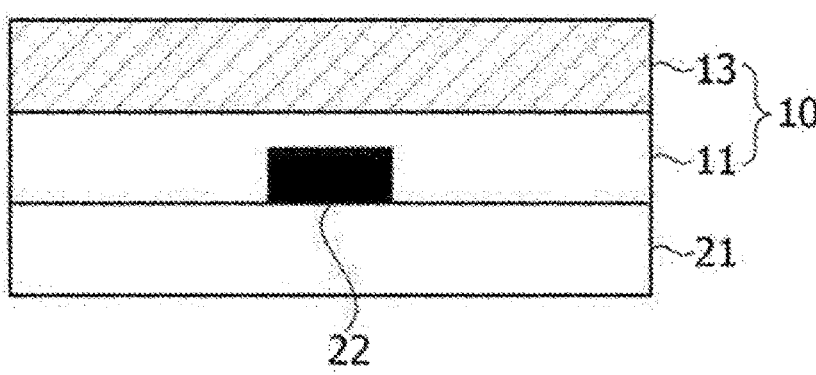

THERMOSETTING RESIN COMPOSITION AND ENCAPSULATION FILM USING THE SAME

CROSS-REFERENCE TO RELATED APPLICATIONS

The present application is a National Phase entry pursuant to 35 U.S.C. § 371 of International Application No. PCT/KR2021/010949, filed on Aug. 18, 2021, and claims the benefit of and priority to Korean Patent Application No. 10-2020-0104009, filed on Aug. 19, 2020, the entire contents of which are incorporated by reference in their entirety for all purposes as if fully set forth herein.

TECHNICAL FIELD

The present application relates to a thermosetting resin composition, an encapsulation film using the same, an organic electronic device comprising the same, and a method for manufacturing the organic electronic device.

BACKGROUND

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the biggest problem that the prior art has tried to solve is a durability problem. The organic materials and the metal electrodes, and the like included in the OLED are very easily oxidized by external factors such as moisture. Therefore, products comprising OLEDs are very sensitive to environmental factors. Accordingly, various methods have been proposed to effectively block penetration of oxygen or moisture from the outside into an organic electronic device such as OLED.

In particular, a composition for encapsulation comprising a photocurable mixture and an initiator, capable of forming a barrier layer with a low permeation rate of oxygen, moisture, water vapor and chemicals has been disclosed. However, in such case, when a photocuring type composition is used as an encapsulation film, a problem that the panel of the organic electronic device is bent at a high temperature or oblique bubbles are thus generated may be caused.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

DISCLOSURE

Technical Problem

The present application is intended to provide an encapsulation film capable of forming a structure that can block moisture or oxygen flowing into an organic electronic device from the outside, and implementing heat resistance and durability of the organic electronic device under severe conditions such as high temperatures.

Furthermore, the present application may have excellent moisture barrier properties and implement an appropriate storage elastic modulus at high temperatures, by satisfying a gel fraction of an encapsulation layer within a specific range, and it is intended to improve durability of an organic electronic device by minimizing the concentration of chlorine ion residues to suppress occurrence of dark spots appearing on the organic electronic element, while implementing excellent reliability under high temperature conditions by controlling an elastic region or a gel fraction in a specific range.

The technical problems of the present disclosure are not limited to the technical problems as mentioned above, and other technical problems not mentioned will be clearly understood by those skilled in the art from the following description.

Technical Solution

The terms used in the present application are only used to describe specific examples, which are not intended to limit the present disclosure. The singular expression includes the plural expression unless the context clearly dictates otherwise. In the present application, the terms such as "comprise" or "have" are intended to designate the existence of features, numbers, steps, operations, components, parts or combinations thereof described in the specification, but it should be understood that the presence or addition possibility of one or more other features, numbers, steps, operations, components, parts or combinations thereof is not excluded in advance.

Unless defined otherwise, all terms used herein, including technical or scientific terms, have the same meanings as those commonly understood by those having ordinary knowledge in the technical field to which the present disclosure belongs. Terms such as those defined in commonly used dictionaries should be interpreted as having meanings consistent with the meanings in the context of the related art, and should not be interpreted in ideal or excessively formal meanings, unless clearly defined in the present application.

<Encapsulation Film>

An encapsulation film may be provided according to one example of the present application. The present application may provide an encapsulation film comprising an encapsulation layer, as described below. The encapsulation layer may seal the top surface of an organic electronic element formed on a substrate, and in detail, may be applied to seal or encapsulate an organic electronic device such as an OLED.

Here, the term "organic electronic device" means an article or device having a structure including an organic material layer that generates alternate currents of electric charges between a pair of opposite electrodes by using holes and electrons, where an example thereof may include photovoltaic devices, rectifiers, transmitters and organic light emitting diodes (OLEDs), and the like, but is not limited thereto. In one example of the present application, the organic electronic device may be an OLED.

The encapsulation film according to the present application may comprise an encapsulation layer including an encapsulation resin, where the encapsulation resin may comprise an olefin-based resin having a thermosetting functional group.

In the present disclosure, the encapsulation layer is formed by a thermosetting method, rather than a photocuring method, and accordingly, an encapsulation resin, which is different from that of the photocuring method, may be used. Here, the photocuring method and the thermosetting method mean that the method of cross-linking and polymerizing each other to form a cured product is by light and heating, respectively.

Conventionally, an encapsulation layer produced by a photocuring method was mainly used, where there was a problem that a phenomenon, in which the panel of the organic electronic device was bent at a high temperature, occurred, and as a result, as oblique bubbles were generated upon laminating and curing the encapsulation film and the substrate, the reliability of the organic electronic element, to which the encapsulation layer according to the photocuring method was applied, was deteriorated.

Meanwhile, in order to suppress the bending phenomenon of the panel upon lamination and curing, it was required to increase the elastic portion of the encapsulation film at a high temperature, but according to the photocuring method, there was a limit in increasing the elastic portion (EP) at a high temperature of 85° C. or more to a certain level or more, whereby it was difficult to implement a high elastic portion.

Therefore, the present application may provide an encapsulation film having a high elastic portion or gel fraction through thermosetting by introducing an olefin-based resin having a thermosetting functional group into the encapsulation layer, as described below, and may provide an organic electronic device with improved heat-resistant durability at a high temperature.

Meanwhile, the encapsulation layer of the present application may comprise a filler, preferably, an inorganic filler as needed so that the movement path of moisture or humidity penetrating into the encapsulation structure may be lengthened to suppress the penetration thereof, and barrier properties against moisture and humidity may be maximized through the interaction with the matrix structure of the encapsulation resin and the moisture adsorbent, and the like. In order to increase the moisture penetration distance, it is necessary to increase the content of the inorganic filler, where if the inorganic filler is included in the photocurable resin composition in an amount of a certain content or more, the curing by light is prevented due to the inorganic filler, so that there is a problem that it is difficult for the photocuring resin to have a sufficient curing degree, but the present application can solve this problem by using an encapsulation resin that can be cured by heat.

In one embodiment, the encapsulation layer according to the present application may have a concentration of chlorine ion residues of 1,000 ppm or less as measured by combustion ion chromatography (IC). Specifically, the concentration of chlorine ion residues may be 900 ppm or less, 800 ppm or less, 700 ppm or less, 600 ppm or less, or 500 ppm or less, and the lower limit thereof may be 10 ppm or more.

The concentration of chlorine ion residues can be measured by combustion ion chromatography (C-IC) by preparing 0.1 g of an encapsulation layer specimen. The measurement can be performed after equipment stabilization, and the quantitative analysis can be performed by setting the standard material and the sample to the following IC conditions. It can be performed using IC (ICS-5000DP from Dionex) and AQF (AQF-2100H from Mitsubishi) as measuring instruments.

Combustion temperature: Inlet temperature 900° C., Outlet temperature 1,000° C.

Gas flow rate: Ag gas 200 mL/min, 02 gas 400 mL/min

Main column: Dionex IonPac AS18 analytical (4 mm×250 mm)

Guard column: Dionex IonPac AG18 guard (4 mm×50 mm)

Eluent: 30.5 mM KOH

Eluent flow rate: 1 mL/min

Sample injection volume: 20 μL

Detector: Suppressed Conductivity Detector

SRS current: 76 mA

Isocratic/Gradient condition: Isocratic

When the chlorine ion residues remain in the organic electronic element, they may act as foreign substances in the organic electronic element, so that adverse effects, such as appearance of dark spots on the organic electronic element, are caused on the element to greatly reduce the quality, whereby there may be a problem that the durability of the element cannot be sufficiently secured. Accordingly, the present application provides an organic electronic element having excellent reliability by providing a thermosetting resin composition having a significantly lowered concentration of chlorine ion residues.

That is, as described above, the encapsulation film of the present application may satisfy the elastic portion or gel fraction in a specific range, thereby providing an encapsulation layer with excellent reliability by minimizing the chlorine ion residues simultaneously, while implementing equivalent or better heat resistance compared to the conventional photocuring type composition.

In an embodiment of the present application, the encapsulation layer may have an elastic portion of 46% or more as calculated by General Formula 1.

$$\text{Elastic portion (Ep, unit: \%)}=100\times\sigma_2/\sigma_1 \qquad \text{[General Formula 1]}$$

In General Formula 1 above, $\sigma_1$ is the stress value measured 1 second after applying a strain of 30% to a specimen, wherein the specimen is prepared by laminating the encapsulation layer to a film having a size of 20 cm×30 cm and a thickness of 600 μm, and then loaded by applying a normal force of about 150 gf at 85° C. thereto using a parallel plate in a laminated state by means of ARES (Advanced Rheometric Expansion System) in the stress relaxation stress relaxation test) mode, and $\sigma_2$ is a stress value measured after maintaining a state of applying the strain to the specimen for 180 seconds.

Here, the term "ARES (Advanced Rheometric Expansion System)" is a rheological property measuring instrument that evaluates viscoelastic properties such as viscosities, shearing moduli of elasticity, loss coefficients, and storage elastic moduli of materials. The instrument is a mechanical measuring device that can apply a dynamic state and a steady state to a specimen, and measure the transmitted torque, which is the degree to which the specimen resists the stress thus applied.

As one example, in the encapsulation layer, the lower limit of the elastic portion calculated by the following general formula 1 may be 47% or more, 48% or more, 49% or more, 50% or more, 51% or more, 52% or more, 53% or more, 54% or more, 55% or more, 56% or more, 57% or more, 58% or more, 59% or more, 60% or more, 61% or more, 62% or more, 63% or more, 64% or more, 65% or more, 70% or more, 75% or more, 80% or more, 82% or more, 85% or more, or 90% or more, and the lower limit thereof is not limited, but may be less than 100%. As such an elastic portion has a higher value, it is advantageous to increase the amount of fillers such as moisture adsorbents, and thus the rate of change to the external environment is small even in extreme environments such as high temperature and high humidity, so that it is possible to suppress the occurrence of oblique bubbles due to volume expansion.

In an embodiment of the present application, the cured product of the thermosetting resin composition may have a gel fraction of 70% or more as represented by General Formula 2.

$$\text{Gel fraction (Gel Content, unit: \%)} = (B/A) \times 100 \quad \text{[General Formula 2]}$$

In General Formula 2 above, A represents an initial mass of a specimen of encapsulation layer, B represents a dry mass of an insoluble content of the specimen of the encapsulation layer that does not pass through a 200 mesh (pore size 200 μm) net when the specimen of the encapsulation layer is immersed in 70 g of toluene at 60° C. for 3 hours and then filtered through the 200 mesh net.

As one example, the lower limit of the gel fraction represented by General Formula 2 above may be 71% or more, 73% or more, 75% or more, 77% or more, 79% or more, 81% or more, 83% or more, 85% or more, 87% or more, 89% or more, 90% or more, 91% or more, 92% or more, 94% or more, 95% or more, 96% or more, 97% or more, or 99% or more, and the upper limit thereof is not limited, which may be less than 100%. When such a gel fraction satisfies the above range, the encapsulation layer satisfies a crosslinking structure and a crosslinking degree within an appropriate range, thereby being capable of implementing excellent adhesion and moisture barrier properties.

In an embodiment of the present application, the encapsulation resin is prepared by a thermosetting resin composition comprising a peroxide (α), an acidic solution (β) and an olefin-based resin (γ), which comprises the olefin-based resin having a thermosetting functional group.

In one example, the weight ratio (α/β) of the peroxide (α) to the acidic solution (β) may satisfy a range of 200 or less. In this specification, the weight of the acidic solution (β) means the weight of an acidic material (e.g., HCl, etc.) introduced to a solvent in order to make the acidic solution, which means the weight excluding the weight of the solvent. As one example, the upper limit of the weight ratio (α/β) of the peroxide (α) and the acidic solution (β) may be 190 or less, 180 or less, 170 or less, 160 or less, 150 or less, 140 or less, 130 or less, 120 or less, 110 or less, 100 or less, 90 or less, 80 or less, 70 or less, 60 or less, 50 or less, 40 or less, 30 or less, or 20 or less, and the lower limit thereof is not greatly limited, but may be 5 or more, 10 or more, or 15 or more.

Also, in one example, the peroxide (α) may be included in an amount of 1.2 parts by weight or more relative to 100 parts by weight of the olefin-based resin (γ). As one example, the lower limit of the peroxide (α) may be 1.25 parts by weight or more, 1.3 parts by weight or more, 1.35 parts by weight or more, 1.4 parts by weight or more, 1.45 parts by weight or more, or 1.5 parts by weight or more, and the upper limit thereof may be 10 parts by weight or less, 7 parts by weight or less, 5 parts by weight or less, 4 parts by weight or less, or 3 parts by weight or less.

In the present application, the encapsulation resin may be prepared by the reaction of the peroxide (α), the acidic solution (β) and the olefin-based resin (γ), where chlorine ion residues derived from the peroxide (α) and the acidic solution (β) by the reaction may occur. When these chlorine ion residues remain in the organic electronic element, they may act as foreign substances on the organic electronic element, so that adverse effects, such as appearance of dark spots on the organic electronic element, are caused on the element to greatly reduce the quality, whereby there may be a problem that the durability of the element cannot be sufficiently secured. Accordingly, the present application may provide an organic electronic element with excellent reliability by providing an encapsulation layer in which the contents of starting materials required for preparing the encapsulation resin as described above are controlled to lower the concentration of chlorine ion residues to a certain level or less.

Here, the peroxide (α) is an oxide having a peroxy group, and −2 valent $O_2$ ($[\text{—OO—}]^{2-}$) in the molecule, which is not limited as long as it performs an epoxy reaction with the olefin-based resin (γ), and, as one example, it may be meta-chloroperoxybenzoic acid (mCPBA), dimethyldioxirane (DMDO), or the like.

The acidic solution (β) is a solution of an organic or inorganic acid having a pH of 6 or less, and, as one example, it may be an aqueous solution of hydrochloric acid (HCl), phosphoric acid ($H_3PO_4$), nitric acid ($HNO_3$), sulfuric acid ($H_2SO_4$), and the like.

The olefin-based resin (γ) may comprise a polymer derived from an olefin-based monomer. In one example, the polymer derived from the olefin-based monomer may comprise, for example, an isoolefin monomer or a multiolefin monomer, and may be prepared by polymerization of the monomers.

The isoolefin may be exemplified by, for example, isobutylene, 2-methyl-1-butene, 3-methyl-1-butene, 2-methyl-2-butene, 1-butene, 2-butene, methyl vinyl ether, indene, vinyltrimethylsilane, hexene, or 4-methyl-1-pentene. The multiolefin may be exemplified by, for example, isoprene, butadiene, 2,3-dimethyl-1,3-butadiene, myrcene, 6,6-dimethyl-fulvene, hexadiene, cyclopentadiene, or piperylene. Other polymerizable monomers, such as styrene and dichlorostyrene, may also be homopolymerized or copolymerized. In one example, the olefin-based resin may be a homopolymer or copolymer of the isoolefin and/or multiolefin, which may be exemplified by, for example, polybutadiene, polyisoprene, polyisobutylene or butyl rubber.

In one example of the present application, the olefin-based resin (γ) is a homopolymer of a butylene monomer; a copolymer obtained by copolymerizing a butylene monomer and another polymerizable monomer; a reactive oligomer using a butylene monomer; or a mixture thereof. The butylene monomer may include, for example, 1-butene, 2-butene or isobutylene.

Other monomers polymerizable with the butylene monomer or derivative may include, for example, isoprene, styrene or butadiene, and the like. By using the copolymer, it is possible to maintain physical properties such as processability and a crosslinking degree, so that heat resistance of a pressure-sensitive adhesive itself can be secured when applied to an organic electronic device.

In one example of the present application, the olefin-based resin (γ) may comprise a copolymer of diene and an olefin-based compound including one carbon-carbon double bond. Here, the diene may be a monomer polymerizable with the olefin-based compound, and may include, for example, isoprene or butadiene, and the like. In addition, the olefin-based compound may include butylene and the like. More specifically, the copolymer of diene and an olefin-based compound including one carbon-carbon double bond may be a butyl rubber.

The olefin-based resin (γ) may have one or more double bonds in the main chain of the resin after being copolymerized in that the diene compound is copolymerized together, where such a double bond may be used to introduce a thermosetting functional group to be described below.

In an embodiment of the present application, the encapsulation resin prepared by the reaction of the peroxide ($\alpha$), the acidic solution ($\beta$) and the olefin-based resin ($\gamma$) may be an olefin-based resin having a thermosetting functional group. That is, the thermosetting resin composition of the present application may comprise an olefin-based resin having a thermosetting functional group as the encapsulation resin.

The thermosetting functional group may be derived from the unsaturated group in the olefin-based resin ($\gamma$) by reaction of the peroxide ($\alpha$), the acidic solution ($\beta$) and the olefin-based resin ($\gamma$). In this specification, the meaning that it is derived from an unsaturated group may mean that the thermosetting functional group is introduced into an unsaturated group such as a double bond present in the main chain of the olefin-based resin ($\gamma$).

In the present application, the thermosetting functional group means a functional group capable of being crosslinked and polymerized with each other by heating at a predetermined temperature or higher to form a cured product. The thermosetting functional group may include a hydroxyl group, a carboxyl group, an amino group and an epoxy group, and may be one or more functional groups selected from the group consisting of the foregoing, where the thermosetting functional group may be one type or two or more types.

In an embodiment of the present application, the encapsulation resin may have a weight average molecular weight (Mw) to a degree capable of being molded into the film shape of the encapsulation layer. For example, the encapsulation resin may have a weight average molecular weight of about 100,000 to 2,000,000 g/mol, where the lower limit thereof may be 200,000 g/mol or more, 250,000 g/mol or more, 300,000 g/mol or more, 350,000 g/mol or more, 400,000 g/mol or more, 450,000 g/mol or more, 500,000 g/mol or more, or 550,000 g/mol or more, and the upper limit thereof may be 1,500,000 g/mol or less, 1,200,000 g/mol or less, 1,000,000 g/mol or less, 800,000 g/mol or less, 70 g/mol or less, or 600,000 g/mol or less. The encapsulation layer according to the present application may also comprise two types of encapsulation resins having different weight average molecular weights, but may also comprise only one type of encapsulation resin obtained by controlling the contents of the starting materials when preparing the encapsulation resin, as described above. Here, the weight average molecular weight means a value converted to standard polystyrene measured by GPC (gel permeation chromatography), and unless otherwise specified, the unit is g/mol. However, the resin does not necessarily have the above-mentioned weight average molecular weight.

In one example of the present application, the encapsulation layer may further comprise a curing agent. The curing agent is a compound capable of chemically bonding with the thermosetting functional group introduced into the encapsulation resin obtained above, and an appropriate compound may be selected and used according to the type of the thermosetting functional group.

The curing agent may include an isocyanate-based crosslinking agent, an epoxy-based crosslinking agent, an aziridine-based crosslinking agent, a metal chelate-based crosslinking agent, an amine-based crosslinking agent or an amino resin-based crosslinking agent. These curing agents may be used alone and may be used in combination of 2 or more.

For example, when the thermosetting functional group introduced into the encapsulation resin is a hydroxyl group (—OH), an isocyanate-based crosslinking agent in the form of a monomer, dimer, trimer or polymer including an isocyanate group (—NCO) may be used, and more specifically, toluene diisocyanate (TDI), hexamethylene diisocyanate (HDI) or isophorone diisocyanate (IPDI) may be used, but the present disclosure is not limited thereto.

For example, when the thermosetting functional group introduced into the encapsulation resin is an epoxy group, an amine curing agent, an imidazole curing agent, a phenol curing agent, a phosphorus curing agent or an acid anhydride curing agent, and the like may be used, but the present disclosure is not limited thereto.

In addition, a usable curing agent depending on the type of thermosetting functional group introduced into the encapsulation resin may include zinc octoate, iron acetyl acetonate, N,N-dimethyl ethanolamine or triethylene diamine, and the like, but is not limited thereto.

The content of the curing agent is not particularly limited, but it may be included in an amount of about 0.1 to 10 parts by weight relative to 100 parts by weight of the encapsulation resin in order to achieve effective thermosetting without impairing the physical properties of the entire encapsulation film. The content of the curing agent may be, as the lower limit, 0.2 parts by weight or more, 0.3 parts by weight or more, 0.3 parts by weight or more, 0.4 parts by weight or more, 0.5 parts by weight or more, 0.6 parts by weight or more, 0.7 parts by weight or more, or 0.8 parts by weight or more relative to 100 parts by weight of the encapsulation resin, and it may be, as the upper limit, 9 parts by weight or less, 8 parts by weight or less, 7 parts by weight or less, 6 parts by weight or less, 5 parts by weight or less, 4 parts by weight or less, 3 parts by weight or less, 2 parts by weight or less, or 1 part by weight or less relative to 100 parts by weight of the encapsulation resin.

The thermosetting reaction may be performed at a temperature of about 40° C. to 150° C. for about 3 minutes to 180 minutes, but may be appropriately adjusted according to the purpose and use of the invention, without being limited thereto.

In one example of the present application, the thermosetting resin composition may further comprise a curing catalyst to promote the thermosetting reaction. The curing catalyst is one that speeds up a chemical reaction between the curing agent and the thermosetting functional group in the olefin-based resin, which may comprise one selected from the group consisting of a tin catalyst, a bismuth catalyst, a mercury-based catalyst, an amine-based catalyst and a combination thereof. When the curing catalyst of the above type is used, a crosslinking reaction between the curing agent and the thermosetting functional group in the olefin-based resin may proceed rapidly, and a curing efficiency of the thermosetting resin composition may be improved. Specifically, one or more selected from the group consisting of dibutyltindilaurate (DBTDL), zinc octoate, iron acetyl acetonate, N,N-dimethyl ethanolamine and triethylene diamine may be used. These catalysts may be used alone or in mixture of two or more different types.

In one example of the present application, the encapsulation layer may further comprise a curing retardant. The curing retardant may suppress the reaction to the steps before film coating after blending the final encapsulation layer components, and suppress excessive viscosity increase of the resin components. The type of the curing retarder is not particularly limited, but for example, $\beta$-keto esters such as acetylacetone, methyl acetoacetate, ethyl acetoacetate, octyl acetoacetate, oleyl acetoacetate, lauryl acetoacetate or stearyl acetoacetate, or 2,4-hexanedione, benzoylacetone, and the like may be used, and preferably, acetylacetone may be used.

In one example of the present application, the encapsulation layer may further comprise a moisture adsorbent. In this specification, the term "moisture adsorbent" may mean, for example, a chemically reactive adsorbent capable of removing the moisture or moisture penetrated into the encapsulation film to be described below through a chemical reaction therewith.

For example, the moisture adsorbent may be dispersed in the thermosetting resin composition in the form of particles, and thereafter, may be present in a uniformly dispersed state in the encapsulation layer or encapsulation film. Here, the uniformly dispersed state may mean a state where the moisture adsorbent is present at the same density or substantially at the same density even in any part of the encapsulation layer or the encapsulation film. Here, the usable moisture adsorbent may include, for example, a metal oxide, a sulfate salt or an organometallic oxide, and the like. Specifically, an example of the sulfate salt may include magnesium sulfate, sodium sulfate or nickel sulfate, and the like, and an example of the organometallic oxide may include aluminum oxide octylate, and the like.

A specific example of the metal oxide may include phosphorus pentoxide ($P_2O_5$), lithium oxide ($Li_2O$), sodium oxide ($Na_2O$), barium oxide ($BaO$), calcium oxide ($CaO$) or magnesium oxide ($MgO$), and the like, and an example of the metal salt may include sulfate salts such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride ($CsF$), tantalum fluoride ($TaF_5$), niobium fluoride ($NbF_5$), lithium bromide ($LiBr$), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or metal chlorate salts such as barium perchlorate ($Ba(ClO_4)_2$) or magnesium perchlorate ($Mg(ClO_4)_2$), without being limited thereto. As the moisture adsorbent that may be included in the encapsulation layer or the encapsulation film, one of the above-described components may also be used, or two or more types may also be used. In one example, when two or more types of moisture adsorbents are used, calcined dolomite and the like may be used.

Such a moisture adsorbent may be controlled to an appropriate size depending on the application. In one example, the average particle diameter of the moisture adsorbent may be controlled to be 100 to 15000 nm, 500 nm to 10000 nm, 800 nm to 8000 nm, 1 μm to 7 μm, 2 μm to 5 μm, or 2.5 μm to 4.5 μm. The moisture adsorbent having a size within the above range may effectively remove moisture, while being easy to store because the reaction rate with water is not too fast, doing not damage the element to be encapsulated and doing not interfere with the hydrogen adsorption process in relation to a bright spot inhibitor to be described below. In this specification, the particle diameter may mean an average particle diameter, and may be measured by a known method with a D50 particle size analyzer.

The content of the moisture adsorbent is not particularly limited, which may be appropriately selected in consideration of desired barrier properties. The moisture adsorbent may be included in a range of 20 to 200 parts by weight, 25 to 190 parts by weight, 30 to 180 parts by weight, 35 to 170 parts by weight, 40 to 160 parts by weight, or 45 to 155 parts by weight relative to 100 parts by weight of the encapsulation resin. In order to increase the moisture penetration distance, it is necessary to increase the content of the moisture adsorbent, but when the moisture adsorbent is included in the photocurable resin composition in a certain amount or more, the curing by light is prevented due to the moisture adsorbent, so that there may be a problem that it is difficult for the photocuring resin to have excellent values for the gel fraction and the elastic portion (EP) while satisfying the sufficient curing degree. Accordingly, the present application can solve the above problem by using an encapsulation resin that can be cured by heat.

In addition, as will be described below, the encapsulation layer of the present application may further comprise a bright spot inhibitor, where the weight ratio of the bright spot inhibitor to the moisture adsorbent may be in a range of 0.05 to 0.8 or 0.1 to 0.7. In the present application, a bright spot inhibitor is dispersed in the film to prevent bright spots, but the bright spot inhibitor added to prevent bright spots may be included in a specific content ratio with the moisture adsorbent in consideration of moisture barrier properties, which are the original functions of the encapsulation film, and reliability of the element.

The bright spot inhibitor may have an adsorption energy of 0 eV or less for outgases, as calculated by an approximation method of the density functional theory. The lower limit of the adsorption energy is not particularly limited, but may be −20 eV. The type of the outgas is not particularly limited, but may include oxygen, H atoms, $H_2$ molecules and/or $NH_3$. When the encapsulation layer of the present application comprises the bright spot inhibitor, it can prevent bright spots due to the outgas generated in the organic electronic device. In addition, the encapsulation film of the present application comprises the bright spot inhibitor in the second layer located on the surface opposite to the element attachment surface of the first layer facing the organic electronic element upon encapsulation, whereby the damage to the organic electronic element according to the concentration of stress due to the bright spot inhibitor can be prevented. From such a point of view, the first layer may or may not comprise the bright spot inhibitor in 15% or less based on the mass of the entire bright spot inhibitor in the encapsulation film. In addition, the layer that does not contact the organic electronic element except for the first layer may comprise 85% or more of the bright spot inhibitor based on the mass of the entire bright spot inhibitor in the encapsulation film. That is, in the present application, upon element encapsulation, the other encapsulation layer that does not contact the organic electronic element may contain a larger amount of the bright spot inhibitor compared to the first layer facing the organic electronic element, whereby it is possible to prevent physical damage to be applied to the element, while implementing moisture barrier properties and bright spot prevention characteristics of the film.

In one example of the present application, the adsorption energy between the bright spot inhibitor and the bright spot-causing atoms or molecules can be calculated through electronic structure calculation based on the density functional theory. The above calculation can be performed by a method known in the art. For example, in the present application, after making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/Å or less. A series of calculation was performed through VASP as a commercially available code.

The material of the bright spot inhibitor is not limited as long as the material is a material having the effect of preventing the bright spots on the panel of the organic electronic device when the encapsulation film, which will be described below in detail, is applied to the organic electronic device. For example, the bright spot inhibitor may be a material capable of adsorbing a material exemplified by, for example, oxygen, $H_2$ gas, ammonia ($NH_3$) gas, $H^+$, $NH^{2+}$, $NHR_2$ or $NH_2R$ as outgas generated from an inorganic deposition layer of silicon oxide, silicon nitride, or silicon oxynitride deposited on an electrode of an organic electronic element. Here, R may be an organic group, and for example, may be exemplified by an alkyl group, an alkenyl group, an alkynyl group and the like, but is not limited thereto.

In one example, the material of the bright spot inhibitor is not limited as long as it satisfies the above adsorption energy value, which may be a metal or a non-metal. The bright spot inhibitor may comprise, for example, Li, Ni, Ti, Rb, Be, Mg, Ca, Sr, Ba, Al, Zn, In, Pt, Pd, Fe, Cr, Si, or a formulation thereof, may comprise an oxide or a nitride of the material, and may comprise an alloy of the material. In one example, the bright spot inhibitor may comprise nickel particles, nickel oxide particles, titanium nitride, titanium-based alloy particles of iron-titanium, manganese-based alloy particles of iron-manganese, magnesium-based alloy particles of magnesium-nickel, rare earth-based alloy particles, zeolite particles, silica particles, carbon nanotubes, graphite, aluminophosphate molecular sieve particles or meso silica particles. The bright spot inhibitor may be included in an amount of 5 to 100 parts by weight, 6 to 90 parts by weight, 7 to 80 parts by weight, 8 to 70 parts by weight, 9 to 60 parts by weight, 10 parts by weight to 50 parts by weight, 12 parts by weight to 30 parts by weight, or 13 parts by weight to 20 parts by weight relative to 100 parts by weight of the resin component in the encapsulation layer. In this specification, the term resin component may mean the aforementioned encapsulation resin, and may collectively refer to all other resin components that may be included in the encapsulation layer in addition to the encapsulation resin. For example, the resin component may comprise a tackifier to be described below. The present application may increase the content of the bright spot inhibitor compared to the prior art through the above-described compositional formulation, and implement a high curing rate even when a large amount of the bright spot inhibitor is included, whereby the adhesive force and heat-resistant durability of the film can be improved together while realizing the prevention of the bright spot. In addition, the bright spot inhibitor may have a particle diameter in a range of 10 nm to 30 μm, 50 nm to 21 μm, 105 nm to 18 μm, 110 nm to 12 μm, 120 nm to 9 μm, 140 nm to 4 μm, 150 nm to 2 μm, 180 nm to 900 nm, 230 nm to 700 nm or 270 nm to 400 nm. The particle size may be according to D50 particle size analysis. By comprising the bright spot inhibitor, the present application can realize moisture barrier properties and endurance reliability of the encapsulation film together while efficiently adsorbing hydrogen generated in the organic electronic device.

Also, in the present application, as the particle size analysis result of the bright spot inhibitor for a sample filtered through 300-mesh nylon after dissolving the encapsulation layer in an organic solvent, the ratio of the average particle diameter according to D50 to the average particle diameter according to D10 may be in the range of 2.3 to 3.5. The lower limit of the ratio may be, for example, 2.4, 2.5, 2.6 or 2.7, and the upper limit may be, for example, 3.4, 3.3, 3.2, 3.1, 3.0, 2.95 or 2.93. Furthermore, in the present application, as the particle size analysis result of the moisture adsorbent for the sample filtered through 300 mesh nylon after dissolving the encapsulation layer in the organic solvent in the particle size analysis result of the moisture adsorbent, the ratio of the average particle diameter according to D50 to the average particle diameter according to D10 may be in the range of 2.3 to 3.5. The lower limit of the ratio may be, for example, 2.4, 2.5, 2.6 or 2.7, and the upper limit may be, for example, 3.4, 3.3, 3.2, 3.1, 3.0, 2.95 or 2.93. The type of the organic solvent is not particularly limited, but may be, for example, toluene, and the sample may be one measured for a sample cut into, for example, 1.5 cm×1.5 cm. In addition, in this specification, the unit mesh may be a unit of American ASTM standard. By controlling the particle size distribution, the present application can prevent a decrease in moisture barrier reliability due to a decrease in dimensional stability at high temperatures, thereby implementing long-term durability reliability of an organic electronic device.

In one example, the ratio of the particle diameter of the bright spot inhibitor to the particle diameter of the moisture adsorbent may be 2.0 or less. The ratio of the particle diameter may be according to the D50 particle size analysis. The lower limit of the particle diameter ratio may be 0.3, 0.5, 0.6, 0.7, 0.8, 0.9, 1.0, or 1.1 or more, and the upper limit may be 1.9, 1.8, 1.7, 1.6, 1.5, 1.4, 1.3, 1.2, 1.1, 1.0, 0.9 or less. The present application has an object to be intended to block moisture from the outside by preparing an encapsulation film from a thermosetting resin composition, where in order to solve the other technical problem of hydrogen adsorption, the bright spot inhibitor was newly introduced, but there was a technical problem that it was not easy to maintain the original moisture barrier effect while comprising the bright spot inhibitor. The present application implements excellent bright spot prevention performance while maintaining the original moisture barrier effect by adjusting the particle diameter ratio and/or the above-described particle size distribution of the moisture adsorbent and the bright spot inhibitor.

the encapsulation layer may further comprise a tackifier. The tackifier may be, for example, a compound with a softening point of 70° C. or higher, where in an embodiment, it may be 75° C. or higher, 78° C. or higher, 83° C. or higher, 85° C. or higher, 90° C. or higher, or 95° C. or higher, and the upper limit thereof is not particularly limited, but may be 150° C. or lower, 140° C. or lower, 130° C. or lower, 120° C. or lower, 110° C. or lower, or 100° C. or lower. The tackifier may be a compound having a cyclic structure in the molecular structure, where the number of carbon atoms in the cyclic structure may be in the range of 5 to 15. The number of carbon atoms may be, for example, in the range of 6 to 14, 7 to 13, or 8 to 12. The cyclic structure may be a monocyclic compound, but is not limited thereto, which may be a bicyclic or tricyclic compound. The tackifier may also be an olefin-based polymer, where the polymer may be a homopolymer or a copolymer.

In addition, the tackifier may be a hydrogenated compound. The hydrogenated compound may be a partially or fully hydrogenated compound. Such a tackifier may have excellent moisture barrier properties and have external stress relaxation properties, while having good compatibility with other components in the thermosetting resin composition. A specific example of the tackifier may include a hydrogenated terpene-based resin, a hydrogenated ester-based resin or a hydrogenated dicyclopentadiene-based resin, and the like. The weight average molecular weight of the tackifier may be in the range of about 200 to 5,000 g/mol, 300 to 4,000 g/mol, 400 to 3,000 g/mol, or 500 to 2,000 g/mol. The content of the tackifier may be appropriately adjusted as necessary. For example, the content of the tackifier may be included in a ratio of 15 parts by weight to 200 parts by weight, 20 to 190 parts by weight, 25 parts by weight to 180 parts by weight or 30 parts by weight to 150 parts by weight relative to 100 parts by weight of the encapsulation resin. The present application can provide an encapsulation film having excellent moisture barrier properties and external stress relaxation properties by using the specific tackifier.

Also, in an embodiment of the present application, the encapsulation layer may have a storage modulus at 85° C. of 110,000 Pa or more. As one example, the lower limit of the storage modulus at 85° C. may be 120,000 Pa or more, 121,000 Pa or more, 122,000 Pa or more, 125,000 Pa or more, or 130,000 Pa or more, and the lower limit is not limited, but may be 200,000 Pa or less.

The encapsulation layer of the present application maintains the storage modulus in the above range at a high temperature, whereby there is an advantage of small deformation and high dimensional stability even when the encapsulation layer is applied to a final product, and excellent viscoelasticity and durability can be implemented. When the storage modulus of the encapsulation layer is out of the above range, the encapsulation layer is deformed according to the temperature, whereby reliability of a product may be deteriorated and durability may be weakened. Furthermore, when the encapsulation film is applied to a final product, permanent deformation occurs, whereby it may be difficult to implement flexible physical properties.

In an embodiment of the present application, the encapsulation film may be formed of a single-layered encapsulation layer or a multi-layered encapsulation layer. The encapsulation film may be applied to, for example, sealing or encapsulating an organic electronic device such as an OLED.

When formed as a multi-layered encapsulation layer, the encapsulation layer may comprise a first layer facing the organic electronic element when the element is encapsulated, and a second layer located on the surface opposite to the surface of the first layer facing the element. In one embodiment, as shown in (a) of FIG. 2 above, the encapsulation film comprises two or more encapsulation layers, where the encapsulation layer may comprise the first layer (2) facing the organic electronic element upon encapsulation and the second layer (4) not facing the organic electronic element.

As described above, when two or more encapsulation layers are included, the respective layer compositions of the encapsulation layers may be the same or different. The encapsulation layer may be a pressure-sensitive adhesive layer or an adhesive layer.

As shown in (a) of FIG. 2, the encapsulation layer (2, 4) may comprise a first layer (2) and a second layer (4), and the second layer (2) of the encapsulation layer may comprise a bright spot inhibitor (3). In addition, as in (b) of FIG. 2, the second layer (4) may comprise a bright spot inhibitor (3) and a moisture adsorbent (5) together. However, when the encapsulation film is applied on the organic electronic element, the first layer (2), which is the encapsulation layer facing the organic electronic element, may not comprise the bright spot inhibitor and the moisture adsorbent, or even if they are included, may comprise a small amount of 15% or less or 5% or less, on the basis of the weight of the total bright spot inhibitor and moisture adsorbent.

In an embodiment of the present application, the encapsulation film may comprise a metal layer formed on the encapsulation layer. The metal layer of the present application may have thermal conductivity of 20 W/m K or more, 50 W/m K or more, 60 W/m K or more, 70 W/m K or more, 80 W/m K or more, 90 W/m K or more, 100 W/m K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which may be 800 W/m·K or less. By having such high thermal conductivity, the heat generated at the bonding interface upon the metal layer bonding process can be released more quickly. Also, the heat accumulated during the operation of the organic electronic device is rapidly released because of the high thermal conductivity, whereby the temperature of the organic electronic device itself can be kept lower, and the occurrence of cracks and defects is reduced. The thermal conductivity may be measured at any temperature in the temperature range of 15 to 30° C.

Here, the term "thermal conductivity" is a degree representing capability in which a material is capable of transferring heat by conduction, where the unit may be expressed by W/m·K. The unit represents the degree to which the material transfers heat at the same temperature and distance, which means a unit of heat (watt) to a unit of distance (meter) and a unit of temperature (Kelvin).

In one example, the metal layer of the encapsulation film may be transparent and opaque. The metal layer may have a thickness in a range of 3 μm to 200 μm, 10 μm to 100 μm, 20 μm to 90 μm, 30 μm to 80 μm, or 40 μm to 75 μm. The present application can provide a thin film encapsulation film while realizing sufficient heat release effect by controlling the thickness of the metal layer. The metal layer may be a thin metal foil or a polymer base layer deposited with metal. The metal layer is not particularly limited as long as it is a material satisfying the above-described thermal conductivity and containing a metal. The metal layer may comprise any one from a metal, a metal oxide, a metal nitride, a metal carbide, a metal oxynitride, a metal oxyboride, and a formulation thereof. For example, the metal layer may comprise an alloy in which one or more metal elements or nonmetal elements are added to one metal, and may comprise, for example, stainless steel (SUS). In addition, in one example, the metal layer may comprise iron, chromium, copper, aluminum, nickel, iron oxide, chromium oxide, silicon oxide, aluminum oxide, titanium oxide, indium oxide, tin oxide, indium tin oxide, tantalum oxide, zirconium oxide, niobium oxide and a formulation thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer may be deposited by reactive sputtering.

Conventionally, a nickel-iron alloy (invar) was usually used as an encapsulation film, but the nickel-iron alloy has a disadvantage that its price is high, its thermal conductivity is low, and its cutting property is poor. The present application provides an encapsulation film that prevents generation of bright spots of organic electronic devices, has excellent heat release characteristics, and implements process convenience due to magnetism, without using the nickel-iron alloy as the metal layer.

In one example, the encapsulation film of the present application may further comprise a base film or a release film (hereinafter, may be referred to as a "first film"), which may have a structure in which the encapsulation layer is formed on the base or release film. Also, the structure may further comprise a base film, a protective film or a release film (hereinafter, may be referred to as a "second film") formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment may be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which may be appropriately selected depending on the application to which it is applied. For example, in the present application, the thickness of the first film may be 10 μm to 500 μm, preferably, 20 μm to 200 μm or so. If the thickness is less than 10 μm, deformation of the base film may easily occur during the manufacturing process, whereas if it exceeds 500 μm, the economic efficiency is low.

<Method for Producing Encapsulation Film>

In another example, the present application provides a method for producing an encapsulation film.

The production method may comprise a step (S10) of producing an encapsulation resin comprising an olefin-based resin having a thermosetting functional group using a thermosetting resin composition including a peroxide (α), an acidic solution (β) and an olefin-based resin (γ). At this time, the peroxide (α), the acidic solution (β) and the olefin-based resin (γ) may be introduced and reacted at once, or may be introduced sequentially.

In an embodiment of the present application, the thermosetting resin composition may comprise the peroxide (α) and the acidic solution (β) in a weight ratio (α/β) satisfying a range of 200 or less. As one example, the upper limit of the weight ratio (α/β) of the peroxide (α) and the acidic solution (β) may be 190 or less, 180 or less, 170 or less, 160 or less, 150 or less, 140 or less, 130 or less, 120 or less, 110 or less, 100 or less, 90 or less, 80 or less, 70 or less, 60 or less, 50 or less, 40 or less, 30 or less, or 20 or less, and the lower limit thereof is not particularly limited, but may be 5 or more, 10 or more, or 15 or more.

In addition, the thermosetting resin composition of the present application may comprise the peroxide (α) in an amount of 1.2 parts by weight or more relative to 100 parts by weight of the olefin-based resin (γ). As one example, the amount of the peroxide (α) may be 1.25 parts by weight or more, 1.3 parts by weight or more, 1.35 parts by weight or more, 1.4 parts by weight or more, 1.45 parts by weight or more, or 1.5 parts by weight or more relative to 100 parts by weight of the olefin-based resin (γ), and the lower limit thereof may be 10 parts by weight or less, 7 parts by weight or less, 5 parts by weight or less, 4 parts by weight or less, or 3 parts by weight or less.

In one embodiment, it may comprise a step (S11) of reacting the olefin-based resin (γ) and the peroxide (α). At this time, the reaction may be performed by dissolving the olefin-based resin (γ) in a non-polar solvent and then introducing the peroxide (α) thereto, where the non-polar solvent is not limited as long as it can dissolve the olefin-based resin (γ), but as one example, it may be toluene.

When introduced, 1.2 parts by weight or more of the peroxide (α) may be satisfied relative to 100 parts by weight of the olefin-based resin (γ). Specifically, the peroxide (α) may be introduced in an amount of 1.25 parts by weight or more, 1.3 parts by weight or more, 1.35 parts by weight or more, 1.4 parts by weight or more, 1.45 parts by weight or more, or 1.5 parts by weight or more relative to 100 parts by weight of the olefin-based resin (γ), and the lower limit thereof may be 10 parts by weight or less, 7 parts by weight or less, 5 parts by weight or less, 4 parts by weight or less, or 3 parts by weight or less.

In addition, the step of reacting the olefin-based resin (γ) with the peroxide (α) may be performed at room temperature for 6 hours to 40 hours, and specifically, the reaction time may be 7 hours or more, 8 hours or more, 9 hours or more, 10 hours or more, 11 hours or more, 12 hours or more, 15 hours or more, or 20 hours or more, and may be 35 hours or less, 30 hours or less, or 25 hours or less. Here, the room temperature means about 18° C. to 35° C., which may be, as one example, 24° C. to 33° C.

Next, it may comprise a step (S12) of introducing an acidic solution (β) to the reactant of the olefin-based resin (γ) and the peroxide (α) to react the mixture at room temperature. At this time, the peroxide (α) and the acidic solution (β) may be introduced in a weight ratio (α/β) satisfying a range of 200 or less. As one example, the upper limit of the weight ratio (α/β) of the peroxide (α) and the acidic solution (β) may be 190 or less, 180 or less, 170 or less, 160 or less, 150 or less, 140 or less, 130 or less, 120 or less, 110 or less, 100 or less, 90 or less, 80 or less, 70 or less, 60 or less, 50 or less, 40 or less, 30 or less, or 20 or less, and the lower limit thereof is not particularly limited, but may be 5 or more, 10 or more, or 15 or more.

It may comprise a step (S20) of mixing and reacting the encapsulation resin obtained above and a curing agent, thereby forming an encapsulation layer. In addition, if necessary, a moisture adsorbent, a reaction accelerator, a curing retardant, an inorganic filler, and the like may be further included.

<Organic Electronic Device and Manufacturing Method Thereof>

In another example, the present application provides an organic electronic device.

As shown in FIG. 3, the organic electronic device may comprise: a substrate (21); an organic electronic element (22) formed on the substrate (21); and an encapsulation film (10), including a thermosetting resin composition, for encapsulating the organic electronic element (22). In detail, the encapsulation film comprising the encapsulation layer, which is a cured product of the thermosetting resin composition, may encapsulate the organic electronic element (22), and the encapsulation film may encapsulate the top surface of the organic electronic element formed on the substrate, for example, all the upper part and sides. In addition, the organic electronic device may be formed by sealing it so that the encapsulation layer or the encapsulation film contacts the top surface of the organic electronic element formed on the substrate.

In an embodiment of the present application, the organic electronic element may comprise a pair of electrodes, an organic layer containing at least a light emitting layer, and a passivation film. Specifically, the organic electronic element may comprise a first electrode layer, an organic layer formed on the first electrode layer and containing at least a light emitting layer, and a second electrode layer formed on the organic layer, and may comprise a passivation film for protecting the electrode on the second electrode layer and the organic layer. The first electrode layer may be a transparent electrode layer or a reflective electrode layer, and the second electrode layer may also be a transparent electrode layer or a reflective electrode layer. More specifically, the organic electronic element may comprise a transparent electrode layer formed on a substrate, an organic layer formed on the transparent electrode layer and containing at least a light emitting layer, and a reflective electrode layer formed on the organic layer.

Here, the organic electronic element may be, for example, an organic light emitting element.

The passivation film may comprise an inorganic film and an organic film. In one embodiment, the inorganic film may be one or more metal oxides or nitrides selected from the group consisting of Al, Zr, Ti, Hf, Ta, In, Sn, Zn and Si. The inorganic film may have a thickness of 0.01 μm to 50 μm or 0.1 μm to 20 μm or 1 μm to 10 μm. In one example, the inorganic film of the present application may be an inorganic material containing no dopant, or may be an inorganic material containing a dopant. The dopant which can be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto. The organic film is distinguished from the organic layer containing at least a light emitting layer in that it does not include a light emitting layer, and may be an organic deposition layer containing an epoxy compound.

The inorganic film or the organic film may be formed by chemical vapor deposition (CVD). For example, as the inorganic film, silicon nitride (SiNx) may be used. In one example, silicon nitride (SiNx) used as the inorganic film may be deposited to a thickness of 0.01 μm to 50 μm. In one example, the organic film may have a thickness in a range of 2 μm to 20 μm, 2.5 μm to 15 μm, or 2.8 μm to 9 μm.

In another example, the present application provides a method for manufacturing an organic electronic device. The manufacturing method may comprise a step of applying the encapsulation film comprising the thermosetting resin composition to a substrate, on which an organic electronic element is formed, so as to cover the organic electronic element. In addition, the manufacturing method may comprise a step of curing the encapsulation film. The curing step of the encapsulation film may mean curing of the encapsulation layer, which may proceed before or after the encapsulation film covers the organic electronic element.

Specifically, the organic electronic element may be formed by forming a transparent electrode on a glass or polymer film used as a substrate by a vacuum evaporation or sputtering method, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the top surface of the organic electronic element of the substrate subjected to the above process.

Advantageous Effects

As described above, the encapsulation layer according to the present application can implement excellent reliability under high temperature conditions and implement an appropriate storage elastic modulus at high temperatures, by controlling an elastic portion in a specific range, and can improve durability by minimizing the concentration of chlorine ion residues to suppress occurrence of dark spots appearing on the organic electronic element, while having excellent moisture barrier properties by satisfying a gel fraction or an elastic portion in a specific range.

Accordingly, it is possible to form a structure capable of blocking moisture or oxygen flowing into the organic electronic device from the outside, and it is possible to provide an encapsulation film capable of implementing heat resistance and durability of the organic electronic device in severe conditions such as high temperatures.

However, the effects of the present disclosure are not limited to the above-mentioned effects, and other effects not mentioned will be clearly understood by those skilled in the art from the following description.

BRIEF DESCRIPTION OF DRAWINGS

FIGS. 1 and 2 are cross-sectional diagrams illustrating an encapsulation film according to one example of the present application.

FIG. 3 is a cross-sectional diagram illustrating an organic electronic device according to one example of the present application.

EXAMPLES

Hereinafter, the present disclosure will be described in more detail through examples according to the present disclosure and comparative examples not according to the present disclosure, but the scope of the present disclosure is not limited by the following examples.

<Encapsulation Resin>

Preparation Example 1

An isobutylene-isoprene rubber (IIR, Cenway IIR-532) having a weight average molecular weight of 570,000 g/mol was prepared and dissolved in toluene at about 20%.

In a 2 L reactor in which nitrogen gas is refluxed and a cooling device is installed for easy temperature control, 3 parts by weight of meta-chloroperoxybenzoic acid (mCPBA) relative to 100 parts by weight of the isobutylene-isoprene rubber was introduced thereto, and then stirred at 30° C. for 8 hours to perform an epoxidation reaction.

Subsequently, an aqueous hydrochloric acid solution prepared by dissolving 0.12 parts by weight of hydrochloric acid (HCl) relative to 100 parts by weight of the isobutylene-isoprene rubber in 1 part by weight of distilled water was introduced thereto, stirred at 30° C. for 1 hour, and then heated to 90° C. and stirred for 1 hour. Thus, a hydroxyl group-introduced isobutylene-isoprene rubber (IIR-OH IR), in which hydroxyl groups (thermosetting functional groups) were grafted to the isoprene units of the main chain, having a solid content of 26% and a weight average molecular weight (Mw) of 580,000 g/mol as an encapsulation resin was prepared.

Preparation Examples 2 to 12

Hydroxyl group-introduced isobutylene-isoprene rubbers (IIR-OH IRs) as the encapsulation resin were prepared in the same manner as in Preparation Example 1, except for parts by weight of meta-chloroperoxybenzoic acid (mCPBA), parts by weight of hydrochloric acid (HCl), epoxidation reaction times and weight average molecular weights shown in Table 1 below.

Comparative Preparation Examples 1 to 5

Hydroxyl group-introduced isobutylene-isoprene rubbers (IIR-OH IRs) as the encapsulation resin were prepared in the same manner as in Preparation Example 1, except for parts by weight of meta-chloroperoxybenzoic acid (mCPBA), parts by weight of hydrochloric acid (HCl), epoxidation reaction times and weight average molecular weights shown in Table 1 below.

Table 1 below summarizes the contents of the respective reactants according to Preparation Examples and Comparative Preparation Examples, which shows parts by weight of meta-chloroperoxybenzoic acid (mCPBA) and parts by weight of hydrochloric acid (HCl) introduced to form the aqueous hydrochloric acid solution, relative to 100 parts by weight of isobutylene-isoprene rubber (IIR), epoxidation reaction times, and weight average molecular weights of the hydroxyl group-introduced isobutylene-isoprene rubbers obtained from Preparation Examples and Comparative Preparation Examples.

TABLE 1

|  |  | mCPBA | HCl | Epoxidation reaction time (hour) | Weight average molecular weight (g/mol) |
|---|---|---|---|---|---|
| Preparation Example | 1 | 3 | 0.12 | 8 | 580,000 |
|  | 2 | 2.5 | 0.08 | 8 | 570,000 |
|  | 3 | 2.5 | 0.08 | 8 | 570,000 |
|  | 4 | 2.5 | 0.04 | 12 | 570,000 |
|  | 5 | 2.5 | 0.04 | 12 | 570,000 |
|  | 6 | 2 | 0.02 | 12 | 560,000 |
|  | 7 | 2 | 0.08 | 12 | 560,000 |
|  | 8 | 2 | 0.08 | 12 | 580,000 |
|  | 9 | 1.5 | 0.01 | 24 | 570,000 |
|  | 10 | 1.5 | 0.08 | 12 | 570,000 |
|  | 11 | 1.5 | 0.08 | 24 | 570,000 |
|  | 12 | 1.5 | 0.08 | 24 | 570,000 |
| Comparative Preparation Example | 1 | 2.5 | 0.01 | 6 | 570,000 |
|  | 2 | 1 | 0.01 | 6 | 570,000 |
|  | 3 | 1 | 0.01 | 8 | 580,000 |
|  | 4 | 0.5 | 0.01 | 24 | 570,000 |
|  | 5 | 3 | 0.12 | 8 | 580,000 |

<Encapsulation Layer>

Example 1

0.81 parts by weight of an isocyanate-based curing agent (Asahi Kasei, Duranate™ TKA-100), 0.7 parts by weight of a tin catalyst (DBTDL) as a reaction accelerator, and 3.1 parts by weight of acetylacetone (Sigma-Aldrich) as a curing retardant were introduced, relative to 100 parts by weight of the hydroxyl group-introduced isobutylene-isoprene rubber obtained according to Preparation Example 1 of the encapsulation resin, and additionally a calcium oxide (CaO) dispersion was mixed so that the amount of calcium oxide (CaO) was 110 parts by weight as a moisture adsorbent, and the solid content was made with toluene to be 14 wt %, thereby preparing a thermosetting resin composition.

The thermosetting resin composition was applied to the release surface of a release PET and dried in an oven at 130° C. for 3 minutes and 30 seconds to prepare an encapsulation layer with a thickness of 40 μm.

Examples 2 to 12

Encapsulation layers were prepared in the same manner as in Example 1, except for parts by weight of the curing agent shown in Table 2 below relative to 100 parts by weight of the respective hydroxyl group-introduced isobutylene-isoprene rubbers obtained according to Preparation Examples 2 to 12.

Comparative Examples 1 to 5

Encapsulation layers were prepared in the same manner as in Example 1, except for parts by weight of the curing agent shown in Table 2 below relative to 100 parts by weight of the respective hydroxyl group-introduced isobutylene-isoprene rubbers obtained according to Comparative Preparation Examples 1 to 5.

Table 2 below shows the weight parts of the added curing agent in Examples 2 to 12 and Comparative Examples 1 to 5, relative to 100 parts by weight of the respective hydroxyl group-introduced isobutylene-isoprene rubbers obtained according to Preparation Examples 1 to 12 and Comparative Preparation Examples 1 to 5.

TABLE 2

|  |  | Curing agent |
|---|---|---|
| Preparation Example | 1 | 0.81 |
|  | 2 | 0.81 |
|  | 3 | 2.43 |
|  | 4 | 0.81 |
|  | 5 | 2.43 |
|  | 6 | 0.81 |
|  | 7 | 0.81 |
|  | 8 | 2.43 |
|  | 9 | 0.81 |
|  | 10 | 0.81 |
|  | 11 | 0.81 |
|  | 12 | 2.43 |
| Comparative Preparation Example | 1 | 0.81 |
|  | 2 | 0.81 |
|  | 3 | 0.81 |
|  | 4 | 0.81 |
|  | 5 | 0 |

Comparative Example 6

To a butyl rubber (Cenway IIR-532) as an encapsulation resin, a hydrocarbon resin (SU-525) as a tackifier was mixed in a weight ratio of 53:47, and 15 parts by weight of a bifunctional acrylate (TCDDA, tricyclodecane dimethanol diacrylate) and 3 parts by weight of a Ni dispersion as a bright spot inhibitor were mixed, relative to 100 parts by weight of the butyl rubber and the tackifier. As a radical initiator, 2,2-dimethoxy-1,2-diphenylethan-1-one (Irgacure 651, Ciba) was introduced thereto in an amount of 0.2 parts by weight relative to the difunctional acrylate, and additionally a calcium oxide (CaO) dispersion was mixed so that the amount of calcium oxide (CaO) was 75 parts by weight as a moisture adsorbent, based on 100 parts by weight of the butyl rubber, the tackifier, the difunctional acrylate and the radical initiator in total, and the mixture was diluted with toluene so that the solid content was 36 wt %, thereby preparing an encapsulation layer solution.

The encapsulation layer solution was applied to the release surface of a release PET, and dried at 130 for 3 minutes in a dryer machine to form an encapsulation layer having a thickness of 40 μm, and then irradiated with light energy of 1.5 J/cm² UV-A to prepare a photocured product.

Experimental Example 1—Concentration of Chlorine Ion Residues 0.1 g of each of the encapsulation layers prepared in Examples and Comparative Examples was prepared, and the concentration of chlorine ion residues was measured by combustion ion chromatography (C-IC).

Measurement was performed after equipment stabilization, and was performed using IC (Dionex' ICS-5000DP) and AQF (Mitsubishi's AQF-2100H), where the standard material and the sample were set to the following IC conditions to perform a quantitative analysis.

Combustion temperature: Inlet temperature 900° C., Outlet temperature 1,000° C.

Gas flow rate: Ag gas 200 mL/min, 02 gas 400 mL/min

Main column: Dionex IonPac AS18 analytical (4 mm×250 mm)

Guard column: Dionex IonPac AG18 guard (4 mm×50 mm)

Eluent: 30.5 mM KOH

Eluent flow rate: 1 mL/min

Sample injection volume: 20 μL

Detector: Suppressed Conductivity Detector

SRS current: 76 mA

Isocratic/Gradient condition: Isocratic

Experimental Example 2—Elastic Portion Test

After laminating each of the encapsulation layers prepared in Examples and Comparative Examples to a size of 20×30 cm and a thickness of 600 μm to prepare a film specimen, a normal force of about 150 gf was applied at 85° C. using a parallel plate by means of ARES (Advanced Rheometric Expansion System, TA's ARES-G2) in the stress relaxation (relaxation test) mode to apply a strain of 30% to the specimen, and then the maximum stress value was measured several times with an interval of 1 second, whereby the average value $\sigma_1$ was measured. In addition, after maintaining the state where the strain was applied to the specimen for 180 seconds, $\sigma_2$, the stress value measured at 180 seconds, was additionally measured and the elastic portion (Ep, unit: %) according to the following general formula 1 was calculated.

$$Ep\ (\%)=100\times\sigma_2/\sigma_1 \qquad \text{[General Formula 1]}$$

In the above measurement, it must be noted that there are no air bubbles when loading the pressure-sensitive adhesive film between the flat plates.

Experimental Example 3—Gel Fraction Test

For each of the encapsulation layers of Examples and Comparative Examples, 0.3 to 0.4 g of the encapsulation layer (initial weight: A) was collected, and the encapsulation layer was immersed in 70 g of toluene at 60° C. for 3 hours. Thereafter, the gel portion was filtered with a 200-mesh wire net (weight of wire net: M), and then dried in an oven at 125° C. for 1 hour. After measuring the combined weight (G) of the gel and the wire net, the gel fraction (unit: %) was calculated according to the following general formula 2 from the gel fraction (unit: %) the dry mass (B=G−M) of the insoluble content of the encapsulation layer that did not pass through the net.

$$\text{Gel content } (\%)=(B/A)\times100 \qquad \text{[General Formula 2]}$$

Experimental Example 4—Measurement of Storage Elastic Modulus

For each of the encapsulation layers of Examples and Comparative Examples above, dynamic viscoelasticity was measured according to JIS K7244-4 (frequency 1 Hz, temperature increase rate 2° C./min), and storage elastic modulus (unit: Pa) at 85° C. in the shear mode was calculated.

Experimental Example 5—High-Temperature Reliability Evaluation

For each of the encapsulation layers prepared in Examples and Comparative Examples, a metal layer was laminated thereon to prepare a film sample. The film sample was bonded together on a glass substrate (0.5 T) and stored at 85° C. and 85% relative humidity for 900 hours, and it was evaluated whether the encapsulation film was lifted or bubbles were generated (oblique bubble phenomenon) according to panel warpage on the substrate. It was classified in the case without film sample lifting or bubble occurrence as O, and it was classified in the case with lifting or bubble occurrence as X.

Table 3 below summarizes the experimental results of Experimental Examples 1 to 5.

TABLE 3

| | | Concentration of chlorine ion residues (ppm) | Elastic portion (Ep, %) | Gel fraction (%) | Storage elastic modulus (Pa) | High-temperature reliability |
|---|---|---|---|---|---|---|
| Example | 1 | 997 | 82 | 94 | 161,548 | O |
| | 2 | 735 | 84 | 96 | 168,124 | O |
| | 3 | 735 | 85 | 97 | 159,101 | O |
| | 4 | 640 | 68 | 91 | 143,669 | O |
| | 5 | 640 | 84 | 96 | 165,481 | O |
| | 6 | 475 | 77 | 92 | 132,939 | O |
| | 7 | 580 | 78 | 92 | 159,190 | O |
| | 8 | 580 | 81 | 94 | 193,475 | O |
| | 9 | 375 | 53 | 91 | 122,971 | O |
| | 10 | 480 | 65 | 91 | 138,975 | O |
| | 11 | 479 | 81 | 89 | 152,113 | O |
| | 12 | 479 | 83 | 90 | 156,630 | O |
| Comparative Example | 1 | 570 | 45 | 92 | 119,990 | X |
| | 2 | 1137 | 83 | 95 | 116,291 | O |
| | 3 | 235 | 9 | 1 | 98,990 | X |
| | 4 | 115 | 8 | 1 | 85,760 | X |

TABLE 3-continued

| | Con-centration of chlorine ion residues (ppm) | Elastic portion (Ep, %) | Gel fraction (%) | Storage elastic modulus (Pa) | High-temperature reliability |
|---|---|---|---|---|---|
| 5 | 1035 | — | 0 | unmeasurable | X |
| 6 | 338 | 24 | 60 | 109,854 | X |

Although the present disclosure was described with reference to the above examples, it will be understood by those skilled in the relevant technical field that the present disclosure can be variously modified and changed within the range without departing from the ideas and regions of the present disclosure as described in the following claims.

The invention claimed is:

1. An encapsulation film, comprising:

an encapsulation layer including an encapsulation resin containing an olefin-based resin having a thermosetting functional group, wherein the encapsulation layer has a concentration of chlorine ion residues of 1,000 ppm or less as measured by combustion ion chromatography (IC), and wherein the encapsulation layer has an elastic portion (Ep) of 46% or more as calculated by General Formula 1:

$$Ep\ (\%) = 100 \times \sigma_2/\sigma_1 \qquad \text{[General Formula 1]}$$

wherein, $\sigma_1$ is a stress value measured 1 second after applying a strain of 30% to a specimen, wherein the specimen is prepared by laminating the encapsulation layer to a film having a size of 20 cm×30 cm and a thickness of 600 μm, and then loaded by applying a normal force of 150 gf at 85° C. thereto in a stress relaxation mode with ARES (Advanced Rheometric Expansion System) using a parallel plate in a laminated state, and wherein $\sigma_2$ is a stress value measured after maintaining a state of applying the strain to the specimen for 180 seconds.

2. The encapsulation film according to claim 1, wherein the encapsulation layer has a gel fraction of 70% or more as represented by the General Formula 2:

$$\text{Gel fraction (\%)} = (B/A) \times 100 \qquad \text{[General Formula 2]}$$

wherein, A represents an initial mass of a specimen of the encapsulation layer, B represents a dry mass of an insoluble content of the specimen of the encapsulation layer that does not pass through a 200 mesh (pore size 200 μm) net when the specimen of the encapsulation layer is immersed in 70 g of toluene at 60° C. for 3 hours and then filtered through the 200 mesh.

3. The encapsulation film according to claim 1, wherein the encapsulation resin is a reaction product of a thermosetting resin composition comprising a peroxide (α), an acidic solution (β) and an olefin-based resin (γ), which comprises the olefin-based resin having a thermosetting functional group.

4. The encapsulation film according to claim 3, wherein a weight ratio (α/β) of the peroxide (α) to the acidic solution (β) satisfies a range of 200 or less, and wherein the peroxide (α) is contained in an amount of 1.2 parts by weight or more relative to 100 parts by weight of the olefin-based resin (γ).

5. The encapsulation film according to claim 1, wherein the olefin-based resin (γ) comprises a copolymer of diene and an olefin-based compound containing one carbon-carbon double bond.

6. The encapsulation film according to claim 1, wherein the thermosetting functional group comprises a hydroxyl group, a carboxyl group, an amino group or an epoxy group.

7. The encapsulation film according to claim 1, wherein the thermosetting functional group is derived from an unsaturated group in the olefin-based resin.

8. The encapsulation film according to claim 1, wherein the encapsulation resin has a weight average molecular weight of 100,000 to 2,000,000 g/mol.

9. The encapsulation film according to claim 1, wherein the encapsulation layer further comprises a curing agent.

10. The encapsulation film according to claim 9, wherein the curing agent is contained in an amount of 0.1 to 10 parts by weight relative to 100 parts by weight of the encapsulation resin.

11. The encapsulation film according to claim 9, wherein the curing agent comprises an isocyanate-based crosslinking agent, an epoxy-based crosslinking agent, an aziridine-based crosslinking agent, a metal chelate-based crosslinking agent, an amine-based crosslinking agent or an amino resin-based crosslinking agent.

12. The encapsulation film according to claim 1, wherein the encapsulation layer further comprises a moisture adsorbent.

13. The encapsulation film according to claim 12, wherein the moisture adsorbent is a chemically reactive adsorbent.

14. The encapsulation film according to claim 12, wherein the moisture adsorbent is contained in a range of 20 to 200 parts by weight relative to 100 parts by weight of the encapsulation resin.

15. The encapsulation film according to claim 1, comprising a multi-layered encapsulation layer.

16. An organic electronic device, comprising:

a substrate;

an organic electronic element formed on the substrate; and the encapsulation film according to claim 1 encapsulating a top surface of the organic electronic element.

17. A method for manufacturing an organic electronic device, comprising:

a step of applying the encapsulation film according to claim 1 to a substrate, on which an organic electronic element is formed, and cover the organic electronic element with the encapsulation film.

* * * * *